US006794865B2

(12) United States Patent
Astley et al.

(10) Patent No.: US 6,794,865 B2
(45) Date of Patent: Sep. 21, 2004

(54) MONITORING THE HEALTH OF A FLUID SYSTEM

(75) Inventors: Kenneth Richard Astley, Derby (GB); Paul Anuzis, Derby (GB); Ian Colin Deuchar Care, Derby (GB); Terry Alan Moore, Cambridgeshire (GB); Peter Gordon Morris, Nottingham (GB); Paul David Rees, Derby (GB)

(73) Assignee: Rolls-Royce PLC, London (GB)

( * ) Notice: Subject to any disclaimer, the term of this patent is extended or adjusted under 35 U.S.C. 154(b) by 32 days.

(21) Appl. No.: 09/949,671

(22) Filed: Sep. 12, 2001

(65) Prior Publication Data

US 2002/0036501 A1 Mar. 28, 2002

(30) Foreign Application Priority Data

Sep. 14, 2000 (GB) .............................................. 0022587

(51) Int. Cl.[7] ................................................ G01V 3/00
(52) U.S. Cl. ....................................... 324/306; 324/309
(58) Field of Search ................................ 324/306, 309, 324/300, 318, 308, 311, 312, 322, 321; 128/653.2; 436/173, 52

(56) References Cited

U.S. PATENT DOCUMENTS

| 4,785,245 A | | 11/1988 | Lew et al. |
| 4,918,021 A | * | 4/1990 | Fossel ......................... 436/64 |
| 4,944,876 A | * | 7/1990 | Miller ................... 210/321.75 |
| 5,072,732 A | | 12/1991 | Rapoport et al. ........ 128/653.2 |
| 5,371,464 A | | 12/1994 | Rapoport |
| 5,635,889 A | | 6/1997 | Stelter ......................... 324/306 |

FOREIGN PATENT DOCUMENTS

| EP | 0 451 962 A2 | 10/1991 |
| GB | 2 341 685 A | 3/2000 |
| WO | WO 90/10880 | 9/1990 |
| WO | WO 91/04706 | 4/1991 |

OTHER PUBLICATIONS

Callagham, Back and Chaplin Modulated adiabatic passage of oriented nuclei; Biophysical Review B vol. 37, No. 10 1, Apr. 1988.*

Zanier et al.; "Thermisch–Oxidative Stabilitaet Von Motorenbenzinen"; Erdoel Erdgas Kohle, Urban Verlag, DE; vol. 116, No. 3, Mar. 2000, pp. 109–115.

Powrie; "Use of Electrostatic Technology for Aero Engine Oil System Monitoring"; 2000 IEEE Aerospace Conference; Piscataway, NJ; IEEE, USA; Mar. 18, 2000; pp. 57–72; vol. 6.

Miller et al.; "In–line Oil Debris Monitor for Aircraft Engine Condition Assessment"; 2000 IEEE Aerospace Conference; Piscataway, NJ, IEEE, USA; Mar. 18, 2000; pp. 49–56; vol. 6.

Centers; "Oil Monitoring Technology" Conference Record, Autotestcon 90, IEEE, Readiness Systems Technology Conference; Sep. 17, 1990; pp. 523–528; San Antonio, Texas.

* cited by examiner

Primary Examiner—Brij B. Shrivastav
(74) Attorney, Agent, or Firm—Oliff & Berridge, PLC (57) ABSTRACT

A method and system for detecting an anomaly in a fluid system, comprising exposing a sample of the fluid system to a first, non-oscillating magnetic field, simultaneously exposing the sample to a second, oscillating magnetic field orthogonal to the first field, modulating one or both of the magnetic fields, and detecting and capturing a resulting NMR signal from the sample. An analysis of the captured signal, typically involving transformation of the signal into an NMR frequency domain spectrum, can be performed to look for specific changes in the signal indicative of the presence of a particular anomaly.

43 Claims, 7 Drawing Sheets

MULTINUCLEAR SPECTRA AT 0.256T (10.88 MHz FOR ¹H) : SOLUTION STANDARDS

$^{27}$Al SPECTRUM AT 2.837MHz

FIG. 5a $^{51}$V SPECTRUM AT 2.863MHz

FIG. 5b $^{55}$Mn SPECTRUM AT 2.685MHz

FIG. 5c $^{59}$Co SPECTRUM AT 2.571MHz

MONITORING THE HEALTH OF A FLUID SYSTEM

FIELD OF THE INVENTION

This invention is generally concerned with monitoring the health of a fluid system and more specifically relates to the detection, and preferably also analysis, of anomalies in a fluid system, for example the detection and analysis of contaminants in a liquid. The invention has particular, although not necessarily exclusive, application in the detection of particulate contaminants in a flowing liquid, for example a flow of oil (e.g. engine lubricating or cooling oil), fuel, coolants (e.g. water) or hydraulic fluid in a power plant or other machinery.

BACKGROUND

Liquids such as oils, fuels and hydraulic fluids are very frequently used in environments in which they are liable to become contaminated, typically with particulate matter. Taking engine lubricating oils as an example, engine components over which the oil washes are subject to wear, creating small particles, often referred to as "chips" or "fines", which are entrained in the oil flow.

These particles, and other particulate debris, may indicate engine component wear and are factors in the deterioration of the condition of the oil and may also cause damage to other engine components if allowed to freely circulate with the lubricating oil flow. In-line collectors, such as filters and gauzes, are therefore used to collect the debris, the collectors being checked and emptied on a regular basis.

Collection and analysis of the particulate debris can also provide information about the condition of oil washed components of the engine. For example, an excessive amount of debris can indicate excessive wear of a component and thereby highlight a potential problem. By analysing the debris, in particular its composition, it is also possible to narrow down the number of components from which the debris might originate, making the task of identifying the faulty or problem component an easier one.

However, the regular checking and emptying of the collectors, and the analysis of the collected debris, amount to a burdensome manual maintenance requirement that it would be desirable to avoid. Moreover, the checking and emptying of the collectors are intrusive processes, which must necessarily be undertaken when the engine is not operating.

In addition to the problems associated with contaminants, particulate or otherwise, liquids such as those discussed above, which often work in very harsh environments, tend to experience a gradual deterioration over time. This deterioration may be of the base liquid itself, for example a change in structure or composition, and/or a loss or reduction in the efficacy of intentional additives (liquid or particulate) to the liquid, for example rust inhibitors or friction reducing additives in oil, which breakdown over time. As with the detection of contaminants, the task of monitoring this deterioration, by sampling and analyzing the oil or other liquid, is intrusive and time consuming.

Definitions

It is useful here to set out a number of definitions of terms used extensively in this specification.

The term "fluid system" refers to both liquids and gases, and includes mixtures of more than one liquid, mixtures of more than one gas, and mixtures of liquids and gases.

The term "additive" is used herein to refer to desired or intended additions to the fluid system, added in amounts usually no more than 10% by weight of the fluid system. Additives will usually be liquids or solids (e.g. particulates suspended in the fluid system).

The terms "anomaly" and "anomalies" are intended to refer to unwanted changes in a fluid system, in particular the presence, and more particularly the build up of contaminants, the reduction in the concentration or efficacy of an additive, and/or the deterioration of the fluid or fluids from which the system is composed.

The term "contaminant" refers to foreign, i.e. unwanted, material present in the fluid system, for instance unwanted particulates and liquids, examples of which would respectively be the "chips" referred to above and water in engine oil.

SUMMARY OF THE INVENTION

The present invention is generally concerned with monitoring the health of a fluid system, preferably in situ. More specifically, it proposes unique Nuclear Magnetic Resonance (NMR) techniques for the detection, and preferably also analysis, of anomalies in the fluid system. The invention is based on an understanding that the existence of anomalies in a fluid system will often cause detectable changes in the NMR characteristics of the fluid system.

Accordingly, in general terms, there is provided a method for detecting an anomaly in a fluid system, the method comprising exposing a sample of the fluid system to a first, non-oscillating magnetic field, simultaneously exposing the sample to a second, oscillating magnetic field orthogonal to the first field, modulating one or both of the magnetic fields, and detecting and capturing a resulting NMR signal from the sample.

The "modulation" may be a controlled intermittent application of the oscillating magnetic field, i.e. a pulsed NMR approach, various examples of which will be well known to the skilled person. Alternatively, a continuous wave approach may be employed, in which, as will be well known to the skilled person, the modulation may be the variation, typically in a linear fashion, of either the frequency of the oscillating magnetic field or, more typically, the field strength of the non-oscillating magnetic field.

An analysis of the captured signal, typically involving transformation of the signal into an NMR frequency domain spectrum, can be performed to look for specific changes in the signal indicative of the presence of a particular anomaly. The parameters affecting the NMR procedure, including the strength of the non-oscillating field and the frequency of the intermittent, oscillating field if the preferred pulsed NMR approach is employed for example, can be selected in dependence on the anomaly it is desired to detect, as will become more apparent from the following discussions.

More detailed aspects and preferred features of the invention are discussed further below in the context of various embodiments of the invention.

BRIEF DESCRIPTION OF THE DRAWINGS

The invention will be described by way of example with reference to the accompanying drawings, in which.

DETAILED DESCRIPTION OF EMBODIMENTS AND EXAMPLES

Prior to setting out more detailed aspects of the invention, it is useful to give a brief overview of the relevant NMR theory.

Like the electron, most nuclei have the property of "spin". Because the nuclei also carry a charge, specifically a positive charge, there is a magnetic moment associated with this spin. When placed in a magnetic field, these nuclei, which might be referred to as the nuclear "magnets", tend to align with the field direction. Only certain orientations are possible—two in the case of a spin ½ nucleus such as a proton.

The energy difference between the orientations of the nuclei ("Zeeman splitting") depends linearly on the strength of the magnetic field B. Transitions between the two orientations can be induced when the frequency of an applied oscillating magnetic field (normally electromagnetic radiation such as a radio frequency (RF) signal), exactly matches the energy difference. This so called resonance condition, is defined by the Larmor equation:

$$\omega = \gamma B$$

where $\omega$ is the angular frequency of the oscillating magnetic field (electromagnetic radiation) and $\gamma$, referred to as the magnetogyric ratio, is a constant for a particular nuclear species.

Different nuclei have different values of $\gamma$ and so resonate at different frequencies in a magnetic field of given strength. For example, at 11.7 T, resonant frequencies for the following nuclei are: $^1$H-500 MHz; $^{13}$C-125.7 MHz; $^{27}$Al-130.3 MHz; $^{29}$Si-99.3 MHz; $^{51}$V-131.4 MHz; $^{53}$Cr-28.3 MHz; $^{55}$Mn-123.3 MHz; $^{59}$Co-118.1 MHz, $^{95}$Mo-32.6 MHz; $^{107}$Ag-20.2 MHz and $^{183}$W-20.8 MHz.

The magnetic field B in the Larmor equation given above is the actual field strength at the nucleus and includes susceptibility effects arising from the bulk magnetic properties of the sample, local variations in these effects due to sample heterogeneity, and the screening effect of the electrons that surround the nucleus itself. Thus:

$$B = B_0(1+\chi)$$

where $\chi$ is the magnetic susceptibility and $B_0$ is the applied magnetic field.

In traditional NMR at high resolution, it is the contribution of the screening electrons to $\chi$ that gives the technique its power to analyse chemical structure: the same nucleus (e.g. $^1$H) will experience different magnetic fields depending on the chemical environment, so that chemically distinct nuclei resonate at slightly different frequencies. The range of these chemical shifts for any particular nucleus is, however, small; 0–10 ppm covers most $^1$H resonances of interest. In order to resolve them, the main applied magnetic field $B_0$ must be maintained homogeneous over the sample volume. A few parts in $10^9$ are commonplace and a few parts in $10^{10}$ achievable with spinning samples under ideal conditions.

As noted above, the general premise on which the invention is based is that the NMR characteristics of a fluid system can be influenced by anomalies in the fluid system. A first, more specific aspect of the invention considers the effect of particulate contaminants, or the reduction in the concentration of a particulate additive on an NMR signal generated by the fluid component or components of the fluid system. This can be thought of as a method of indirectly detecting levels of a contaminant or additive; it is not looking at an NMR signal from the particulate contaminant/additive itself, but rather the influence the particles have on the signal from the fluid.

This approach is possible where the contaminants or the additives have a different magnetic susceptibility than the fluid, because they will then cause local non-uniformities in the magnetic field. This in turn modifies the NMR signal from the fluid, manifesting itself, for instance, in changes of line-width and/or position of the fluid resonance seen in the NMR frequency domain.

Accordingly, adopting a preferred pulses NMR approach, the invention provides a method for detecting the presence of a particulate contaminant or additive in a fluid system, comprising creating a first, non-oscillating magnetic field of a predetermined field strength across a sample of the fluid, intermittently exposing the sample of fluid to a second, oscillating magnetic field orthogonal to the first to generate an NMR signal, detecting the NMR signal from the fluid sample, and analysing the signal to look for changes indicative of the presence of the particulate contaminant or additive in the fluid system.

Typically the step of analysing the signal will comprise transforming the detected signal into an NMR frequency spectrum, for example using well known Fourier transform techniques, and identifying changes in the spectrum, e.g. changes in line-width or resonant frequency, characteristic of the presence of the particulate material.

The "pulsed" NMR approach of this aspect, i.e. in which the oscillating field is intermittently applied, is the preferred approach. Any of the various pulsed NMR techniques known to the skilled person are appropriate.

Another possibility, however, is to use a "continuous wave" approach. Thus, in another aspect, the invention provides a method for detecting a particulate contaminant or a particulate additive in a fluid system, comprising creating a non-oscillating magnetic field across a sample of the fluid, exposing the sample of fluid to a second, oscillating magnetic field orthogonal to the first, and varying the frequency of the oscillating field and/or the field strength of the non-oscillating field to generate an NMR signal, and detecting the NMR signal from the liquid sample.

Analysis of the detected signal can be conducted in a similar manner to the pulsed approach to determine whether the liquid sample contains particulate material.

Usually these indirect techniques will look at the $^1$H spectrum of the fluid system, since hydrogen is a common element in many fluids, including for example oils, fuels, water etc. The methods have been found to be particularly effective in detecting the presence of ferromagnetic particles, which produce a very noticeable disruption of the magnetic field. The methods are therefore very suitable for detecting the presence of particulate contaminants in engine oil, fuel and the like because these contaminant are often the result of wear of ferromagnetic engine components. The method is not limited, however, to the detection of such particles, and another example of its use would be the detection of ice particles in fuel.

It should also be noted that under some conditions liquid contaminants and additives will create similar detectable effects on the NMR signal from the fluid system. For example, liquid contaminants/additives may affect the average magnetic susceptibility of the system, resulting in a detectable shift in the NMR resonance. They may also increase the line width of the NMR signal if they restrict the motion of the fluid system. Also, if the liquid contaminants/additives fail to dissolve (e.g. a colloidal dispersion or a two phase system), localised effects on the magnetic field, similar to those detected for particulates may occur. Thus, the approach described above, whilst particularly suited to the detection of particulates, might also be adopted for detecting liquid contaminants and additives.

A second aspect of the invention proposes what might be termed a direct detection method. That is to say, the detection of an NMR signal from specific contaminants, additives or other components of the fluid system.

As noted above in the discussion of the underlying NMR theory, different nuclear species can be characterized by different magnetogyric ratios ($\gamma$) and so resonate at different frequencies of the oscillating magnetic field for a given field strength of the non-oscillating field. Thus, by tuning the frequency of the oscillating field (or alternatively, the field strength of the non-oscillating field) it is in principle possible to focus detection on specific nuclear species.

Accordingly, there is provided a method of directly detecting the presence of a contaminant or additive in a fluid system, comprising creating a first, non-oscillating magnetic field of a predetermined field strength across a sample of the fluid, exposing the sample of fluid to a second, oscillating magnetic field orthogonal to the first to generate an NMR signal, the predetermined field strength of the non-oscillating field and the frequency of the oscillating field being selected in accordance with the magnetogyric ratio of the contaminant or additive to be detected, detecting the resultant NMR signal, and analysing the signal to look for changes indicative of the presence of the contaminant or additive in the fluid system.

Preferably a pulsed NMR technique is used, in which the liquid sample is intermittently exposed to the oscillating field. However, a Continuous Wave (CW) approach is also possible.

As with the indirect approach discussed above, the NMR signals, typically transformed into frequency spectra, detected with this direct method can be empirically related to amounts, i.e. concentrations of the contaminant or additive in the fluid system, allowing effective, non-intrusive monitoring of these levels. This is because the NMR signal intensity is proportional to the amount of the specific nuclear species being probed present in the sample.

The direct approach has many applications, including for example monitoring the level of additives in oil or fuel, e.g. manganese additives in fuel, in order to provide an indication of when it is necessary to top up the additive.

Advantageously, an extension of this method can be used to detect NMR signals from a plurality of different nuclei of interest, by sequentially operating the method at different frequencies and/or field strengths corresponding to the different magnetogyric ratios of the nuclei. In this way, a non-intrusive analysis of the composition of contaminants or other NMR detectable materials in a fluid system can be conducted for example. This can be achieved, for instance, by using a series of differently tuned RF coils to generate the oscillating field and detect the resulting NMR signal, or more preferably by using a coil that can be electronically re-tuned.

Whether employing a single- or multi-nuclei approach, it may be possible to use this approach to provide useful information about the source of a contaminant in a fluid system. For instance, taking the example of engine oil, the composition of the debris entrained in the oil may give an indication of the engine component from which the debris has come, indicating wear of that component. This use of the method to detect the source of a contaminant can be enhanced by including one or more marker nuclei in potential contaminant sources which are released into the fluid system as part of the contaminant. For instance, taking the engine oil example once more, it might be desirable to dope critical engine components with nuclei which can be easily detected in the oil so that their wear can be readily monitored.

It is to be noted that conventional wisdom suggests that this direct detection approach would not be appropriate for the detection and compositional analysis of metallic particles, because the radio frequency fields typically used to create the oscillating magnetic-field do not penetrate conducting material samples. However, where particulate metallic samples are sufficiently small, as is usually the case with debris in engine oil for example, the skin depth to which the RF field penetrates, particularly at the low magnetic field strengths and frequencies discussed further below, provide an adequate NMR signal for detection.

However, unlike the indirect approach where a strong signal is likely to be received even from a partially polarised fluid system, with this direct approach it may be important to ensure that the fluid system, in particular metallic particles entrained within it, are exposed to the magnetic field for a sufficient time to substantially completely polarise before detection of the NMR signal is attempted. It may also be useful to entrap the particles adjacent the NMR detector in a system which would otherwise carry them away with a flow of the fluid system. This has the advantage of increasing the local concentration of the particulate contaminants, additives or other NMR detectable materials over time, with a resultant strengthening of the NMR signal.

Advantageously, the various techniques discussed above in relation to both aspects of the invention can be used not only to detect the presence of a contaminant, additive, or other NMR detectable material, but also to give an indication of the level of its presence within the fluid sample. This is because a greater amount of these materials in the fluid sample will cause greater changes in the e.g. $^1$H NMR signal in the case of the indirect approach and, as already noted, a greater signal intensity in the case of the direct approach.

This in turn enables the monitoring of the contaminant, additive or other NMR detectable material levels over time, by taking a series of measurements of the NMR signal over time and recording each measurement. This provides a convenient approach to detecting/monitoring, for instance, the build up of a contaminant to undesirable levels, sudden changes in the rate of build up of a contaminant (which may be indicative of an imminent component failure for example), and/or the degradation of an additive over time.

Put more generally, in a further aspect, the present invention proposes using an NOR technique to detect the progression of an anomaly over time. By progression here, it is meant movement of a measurable value away from a base line value, such as the build up of a contaminant over time (in which case the base line might be zero) or the reduction in the concentration of an additive over time (in which case the baseline might be the preferred or initial additive concentration).

In some cases, the base line value may itself be expected to change over time. For example, in an engine oil circulating system one might expect a gradual increase in metallic debris as the engine wears gradually as time goes on. Where this is the case, a similar approach to that discussed above can be adopted, but instead of looking for anomalies based on a change from a fixed base line, the anomaly detection can be based on any change (e.g. sudden increase or decrease) in the rate of change of the base line value. Thus, taking the engine example again, excessive wear of an engine component might exhibit itself as a sudden increase in the build up of metallic contaminants in the oil.

Conventionally, non-clinical NMR is now carried out using high magnetic field strengths, often of the order of 5–20 Tesla or more, corresponding to high resonance frequencies (RF signals), in the order of 200–900 MHz for $^1H$, to produce high resolution spectra. Indeed, the thrust of most research in this field is to strive for ever higher field strengths to give higher resolution. However, in preferred implementations, the present invention proposes to use relatively low field strengths and frequencies, preferably field strengths no higher than 1.5 T, more preferably 1 T or less and even more preferably 0.5 T or less, corresponding respectively to $^1H$ resonance frequencies of about 64 MHz, 43 MHz and 21 MHz. In fact, $^1H$ resonance frequencies as low as 1 MHz, i.e. magnetic field strengths as low as 0.0235 T are not impractical, and even lower field strengths than this may provide useful results.

This preferred approach gives a low resolution output, the effect of which is that the series of peaks seen in a high resolution frequency spectrum merge to form a single peak or resonance.

It may be thought that this loss of resolution would be disadvantageous, because a degree of information is lost from the NMR signal. However, as explained below, it has been found that the presence of particulate contaminants, and other anomalies, can nevertheless be reliably detected, and this low resolution approach has the significant advantage that subsequent analysis is greatly simplified. The possibility it provides for using much less powerful, and hence much smaller magnets than conventional techniques is also a significant advantage.

Thus, considering the indirect approach discussed above, in a low resolution NMR spectrum for a liquid system, e.g. oil, it has been found that the presence of particulate contaminants causes a broadening of the resonance and/or a shift in its center frequency, when compared with the spectrum of an uncontaminated sample. These phenomena are due, respectively, to the perturbation of the homogeneity of the magnetic field and to the change in bulk magnetic susceptibility of the liquid. Using an analytical approach, based on changes in spectra that have been shown experimentally to occur under controlled conditions with known amounts of contaminants, and knowledge of the "basic" spectrum for an uncontaminated sample of a liquid, the detected spectrum can be used to derive the concentration of NMR-active particulate contaminants in the liquid sample.

In practice, ferromagnetic particles are likely to produce the most evident changes in the NMR spectrum. However, the method can be used to identify other types of debris also. Moreover, it may also be possible to distinguish, from measured spectra, different types of particle, because they will have different effects on the line-width and resonance frequency of the peak in the low resolution NMR spectrum.

Similarly, for the direct approach, detecting the NMR signals of specific contaminants etc, low resolution NMR has been successfully employed. In the low resolution spectra obtained from this approach, the resonant frequency indicates the nuclear species of the contaminant or additive, and the amount of material detected can be ascertained empirically from the signal intensity, the intensity being proportional to the amount of material.

Whilst it is possible for any of the above-described techniques to be applied to a stationary liquid sample, one significant advantage of this non-intrusive approach is that the "sample" can simply be an element of a liquid flow, for example flowing through a conduit extending through the generated magnetic fields. This possibility for in-situ, non-intrusive detection and analysis of contaminants can remove the need for regular sampling and checking of the fluid system, for example the regular checking of filters or other debris collectors.

In the various aspects discussed above, the oscillating magnetic field may be provided by a coil carrying an alternating current, driven to produce an RF (radio frequency) signal, the magnetic component of which provides the desired field. Conveniently, the same coil may be used to detect the NMR signal.

The invention also provides systems, operable in accordance with one or more of the methods discussed above, for detecting anomalies in a fluid flow, the systems comprising a non-magnetic, non-metallic conduit through which the fluid flows, a first generator for generating a non-oscillating magnetic field across the conduit, a second generator for simultaneously generating an oscillating magnetic field across the conduit, modulation means for modulating one of the magnetic fields, a detector for detecting a resulting NMR signal from within the conduit, and processing means operable in accordance with one or more of the methods discussed above for extracting from the NMR signal information about an anomaly.

The second generator and the NMR signal detector may each comprise a coil surrounding the conduit, for example an RF-coil. Preferably, a single coil performs both functions.

In one exemplary application, the apparatus may be used to detect the presence and/or concentration of particulate contaminants in or adjacent a debris collector, such as a filter.

It should also be noted that not only does this apparatus offer the possibility for non-intrusive, in-situ detection of debris, it also has the advantage of having no moving parts itself, minimising any maintenance requirement.

Figure 1A:
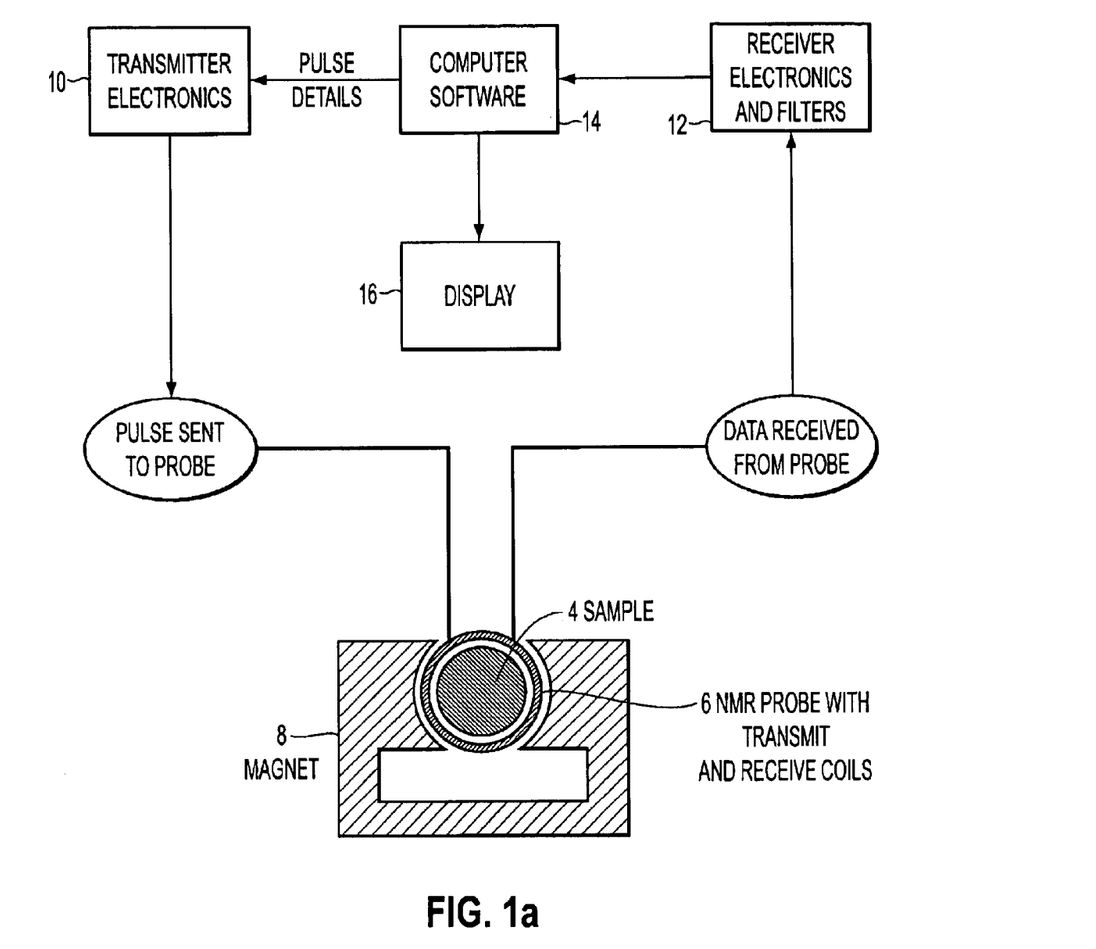
FIGS. 1a and 1b show schematically an apparatus for detecting particulate contaminants in a liquid flow.
Figure 2:
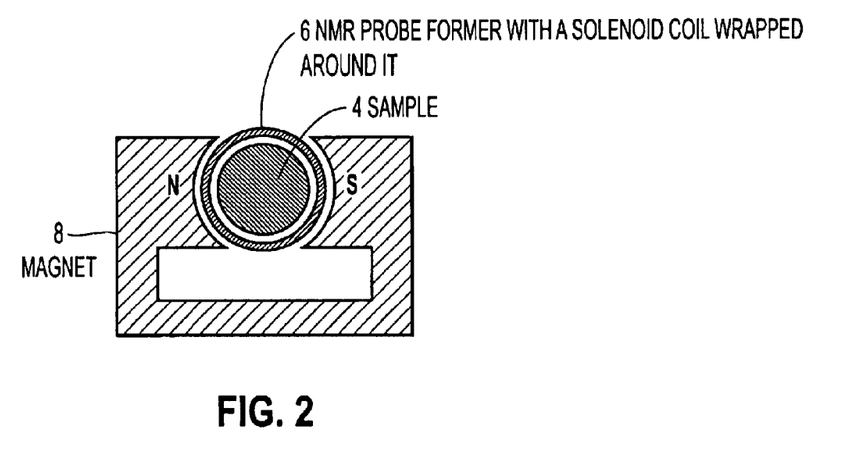
FIG. 2 shows schematically a cross-section through the magnet and coil arrangement of the apparatus of FIGS. 1a and 1b.

Methods according to various aspects of the invention will be exemplified by way of tests which have been implemented using an 11 MHz bench-top NMR spectrometer to study debris suspended in engine oil. The system is illustrated schematically in FIGS. 1a and 2a.

Figure 1B:
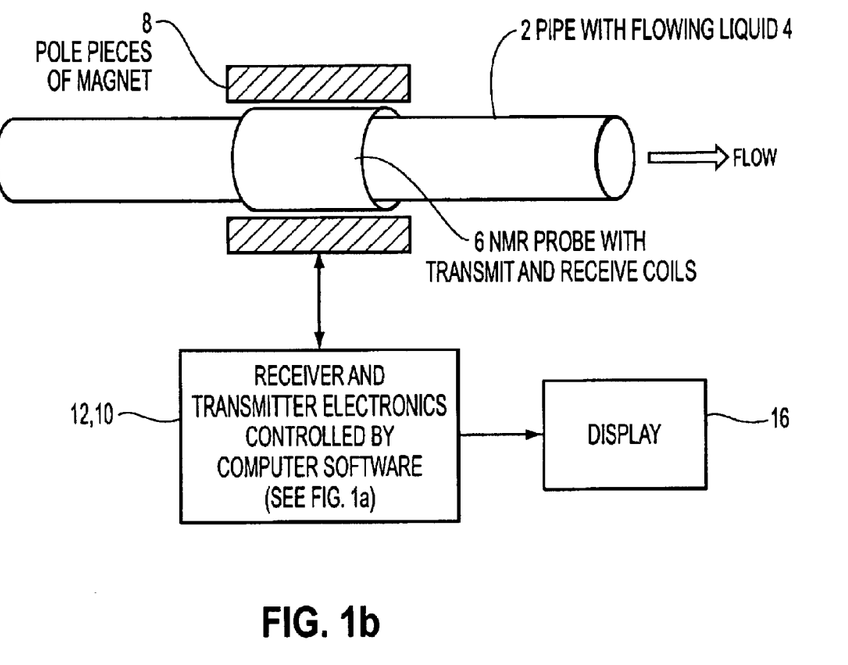

Looking at the system as a whole, the main components are a non-metallic, non-magnetic sample pipe 2, within which the liquid sample 4 to be evaluated flows, an annular probe head 6 that surrounds the sample pipe 2, and hence the sample 4 itself, and a magnet 8 which partially surrounds the probe head 6. The magnet 8 provides a fixed strength, non-oscillating magnetic field, and the probe head 6 both generates an oscillating magnetic field to excite the sample and serves as a detector for the resulting NMR signals from the sample. The probe head is driven to generate its magnetic field in a pulse mode by conventional transmitter electronics 10. NMR signals detected by the probe 6 are collected by conventional receiver electronics 12. The transmitter and receiver electronics are controlled by a digital computer under the instruction of appropriate software 14. The software processes the received NMR signals to generate frequency domain spectra, which can be displayed on an associated display 16.

Figure 3:
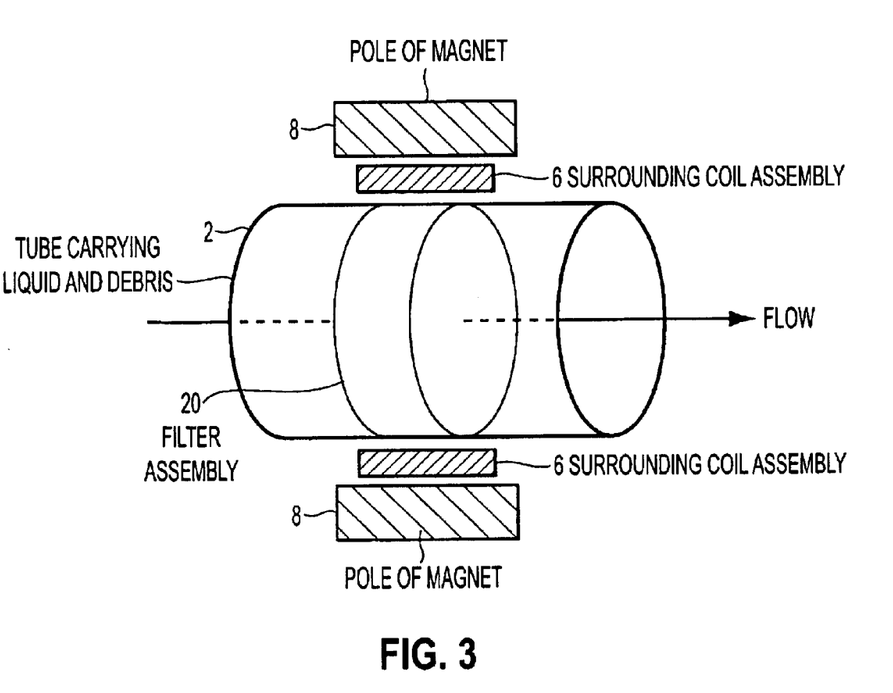
FIG. 3 schematically shows a debris trap in an oil pipe.

As illustrated schematically in FIG. 3, a filter assembly 20 may be located in the pipe adjacent the probe head 6, in order to accumulate particulate material, making the study of its build up over time easier. The filter can also provide the function of a standard particle trap conventionally used in e.g. circulating oil systems, but rather than having to periodically check and empty the filter, it need only be emptied once the NMR system indicates that it is excessively full.

The magnet 8 used in this exemplary bench-top system is a horseshoe-shaped magnet made from light weight, high temperature stable, bonded alloy. Other forms of magnet, including electro-magnets may be used. An example of a particularly appropriate magnet, which is very compact and light weight, is described in U.S. Pat. No. 5,635,989 (which is hereby incorporated by reference).

The magnetic field generated by the horseshoe magnet 8 of the present example is 0.2557 T (Tesla) with a homogeneity of 2 ppm over a cylindrical volume of 10 mm in length by 10 mm diameter. The polepiece 18 diameter is 125 mm with a 56 mm gap between the pole faces.

The probe head 6 includes a combined RF transmitter and receiver coil to perform both the magnetic field generation and NMR signal detection functions. In the tests conducted, three different probe heads 6 have been used with the spectrometer, although only one at any one time. The coils of the three probe heads 6 have the following characteristics:

1: $^1$H tuned at 10.88 MHz, operating at 300 W rf pulse power;
2: multi-nuclear, having variable tuning between 1.960 and 2.89 MHz, operating at 25 W; and
3: multi-nuclear, having variable tuning between 0,440 and 0.702 MHz, operating at 25 W.

All of the probe heads can take sample pipes 2 up to 40 mm in diameter.

The probe coils are solenoidal, of length 50 mm and pitch 5 mm, and are wound on a PTFE body, The multi-nuclear probe 6 can be tuned to the particular resonance of interest, characteristic of the specific nuclear species (e.g. elemental isotope) to be observed. This tuning can be achieved using well known techniques including, for example, adjustment of one or more variable capacitors forming part of a resonant circuit with the radio frequency transmitter/receiver coil. This adjustment is carried out in conjunction with a manufacturer supplied wobble pulse program forming part of the software 14 running on the digital computer controlling operation of the apparatus.

The magnet 8, and probe head 6 are contained in a programmable temperature controlled enclosure (not shown). Two further enclosures hold the associated electronics 10,12.

When tuned the probe 6 is in resonance with the precessing nuclei of interest and data can be obtained in response to the type of pulse programme used. The computer both stores the pulse programme and controls the timings and way it is run. All the pulse programmes used in the tests are conventional.

A simple pulse-acquire pulse sequence has been found sufficient to detect the presence of a compound through one of it's constituent elements. The programme is run when the sample is present and the variables in the programme optimised to give the largest signal. The pulse of radio-frequencies from the probe 6 nutates the nuclear magnetisation away from the static field direction, whereupon it precesses about the magnetic field at the Larmor frequency, and is detected by the receiver. The signal gradually decays, often in an approximately exponential manner. This is known as a free induction decay or FID. This ac signal is digitised by an ADC and stored in the computer memory.

In a typical experiment the pulse-acquire sequence is repeated many times and the digitised signals added together to improve the signal to noise ratio. The final data file is one of signal amplitude as a function of time. The final file is Fourier transformed to convert it to signal amplitude as a function of frequency i.e. an NMR spectrum.

At 0.2557 Tesla static magnetic field (low resolution in the terms discussed above), the intrinsic broadening effects are comparable with or greater than, the chemical shift magnitude of the different chemical groupings present in the sample so typically the resulting spectrum is simple, often a single peak, the area of the peak being proportional to the amount of the nuclei of interest that are present.

Figure 4A:
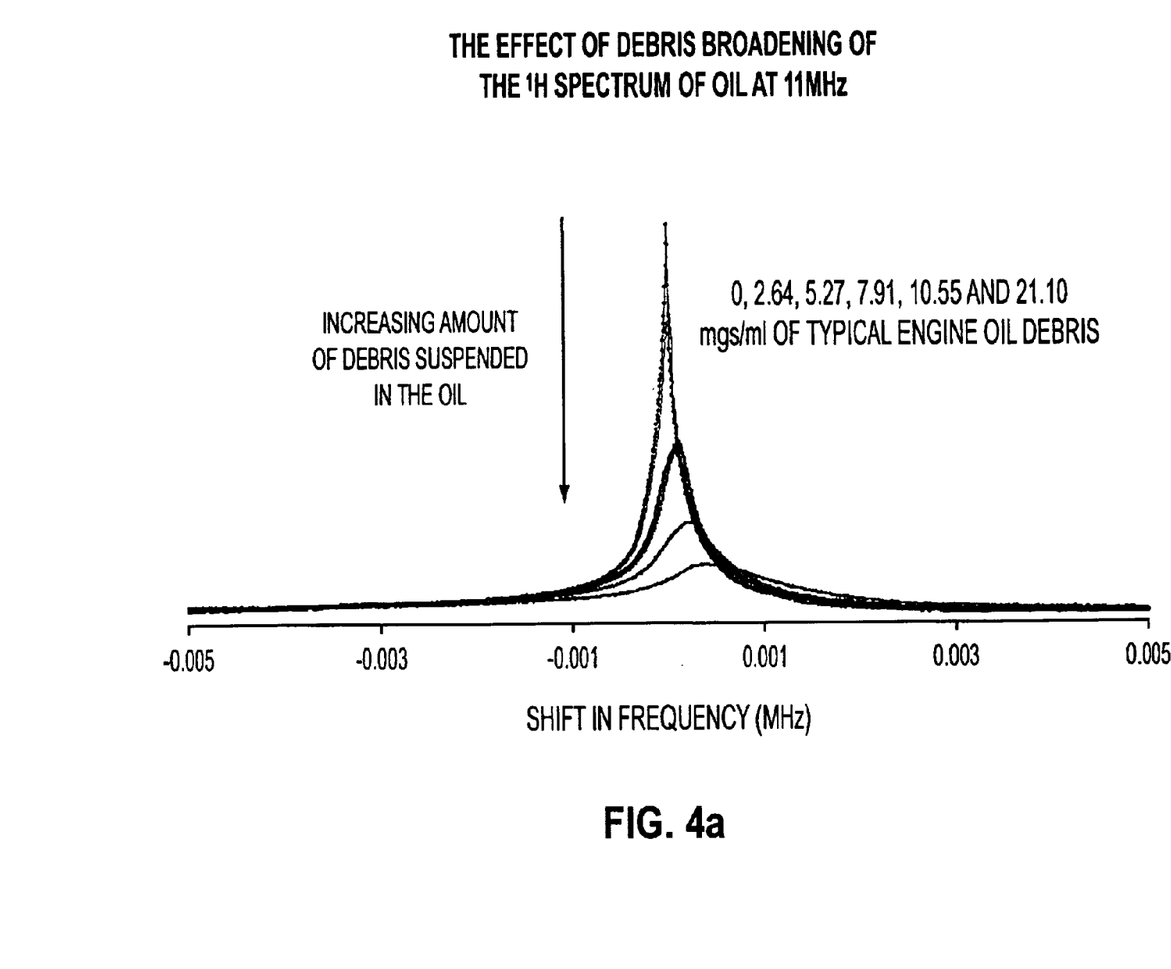
FIG. 4a shows the $^1$H NMR spectrum at 11 MHz of a series of oil samples, generated using an indirect detection method in accordance with the present invention.
Figure 4B:
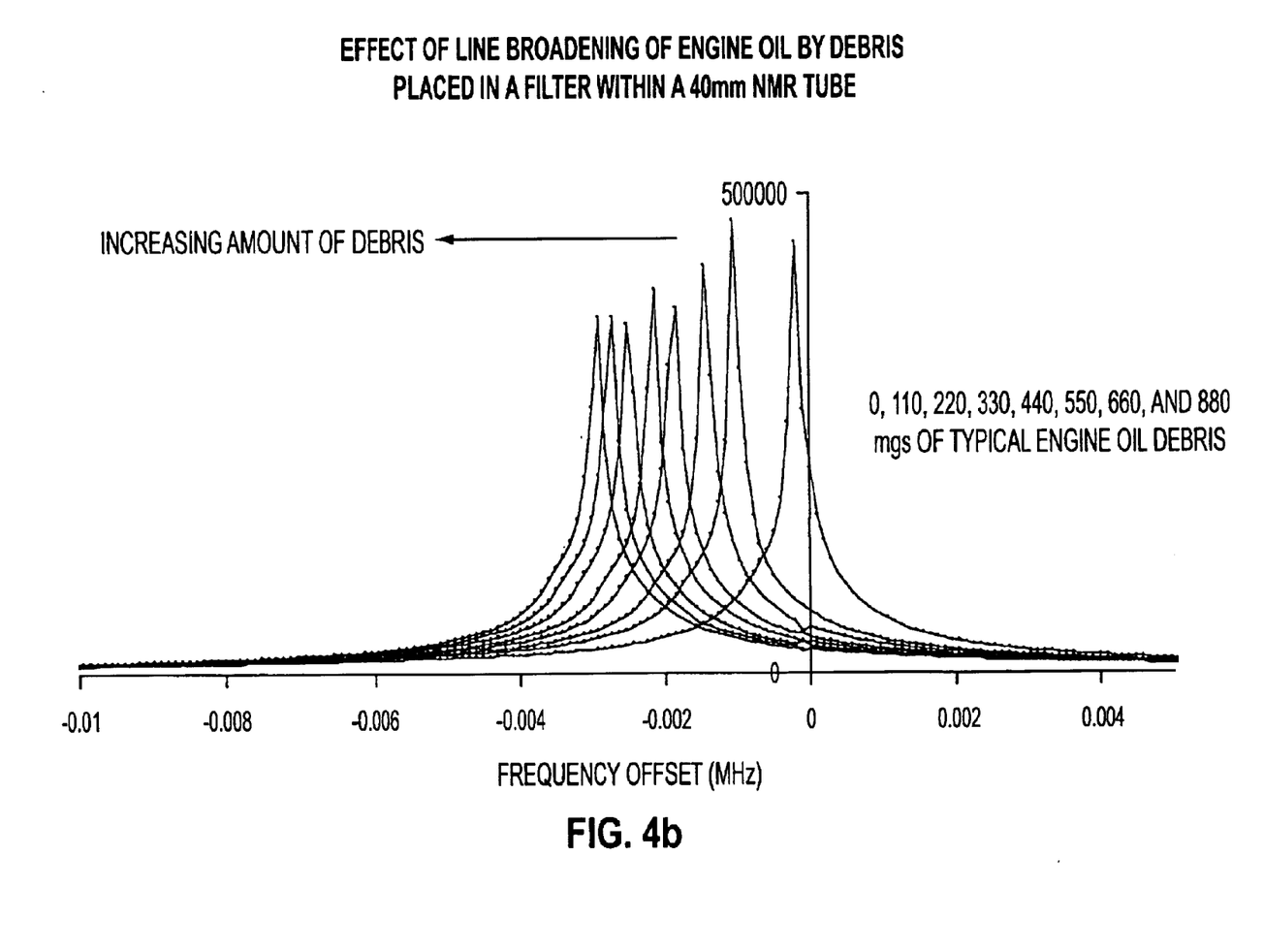
FIG. 4b shows spectra similar to those of FIG. 4a, but illustrating the affect on the spectrum of debris concentrated on a filter.
Figures 5A, 5C:
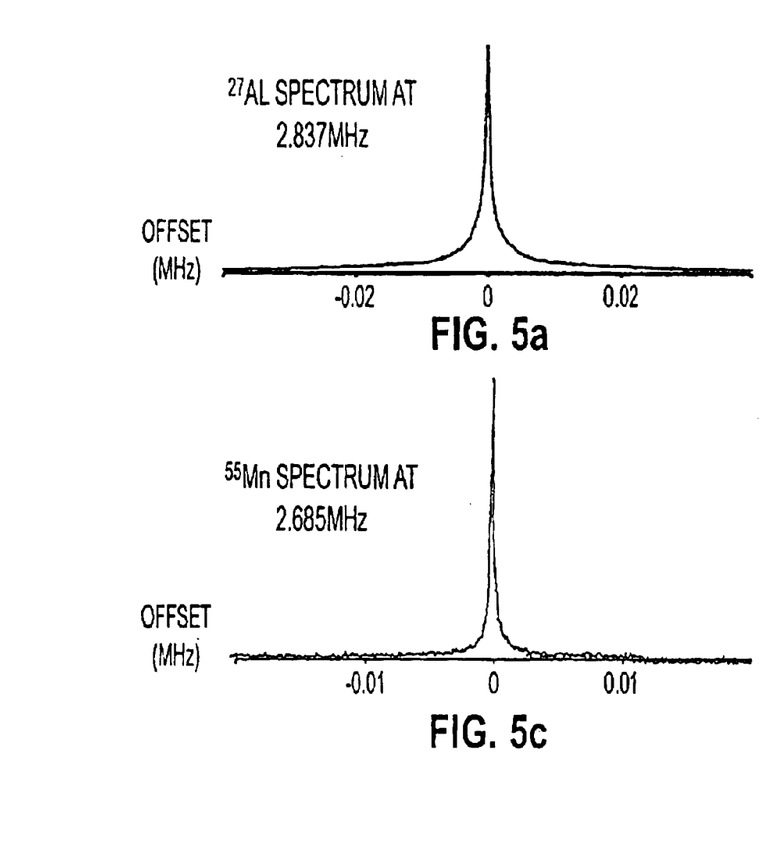
FIG. 5 shows the multi-nuclear spectra obtained at 0.256 T (11 MHz for $^1$H) using a direct detection method in accordance with the invention.
Figure 5B:
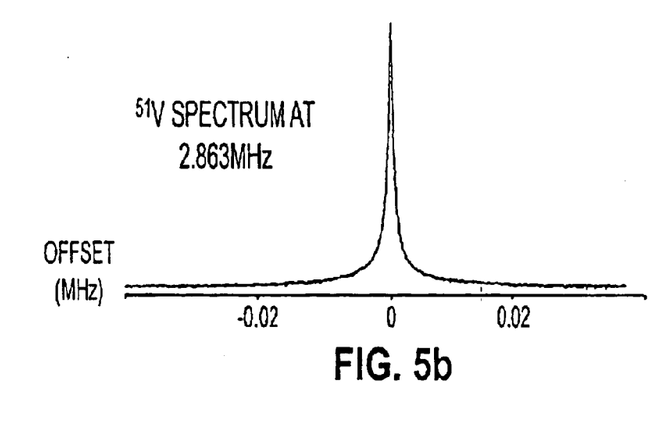
Figure 5D:
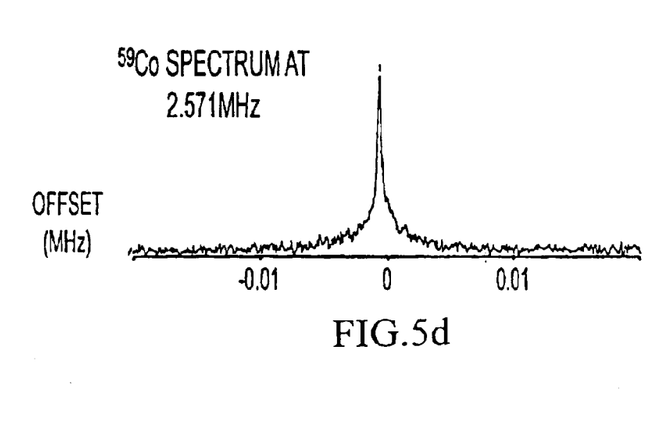

Examples of the results achieved using the NMR system in the manner described are shown in FIGS. 4a, 4b and 5.

The broadening and shifting of the $^1$H spectrum by debris suspended in the oil, seen in FIGS. 4a and 4b, was measured using the probe labelled 1 above which is pre-tuned to $^1$H. FIG. 4a shows the effect of increasing concentrations of debris suspended in oil, whilst FIG. 4b shows the effect of increasing amounts of debris precipitated as a layer on a flat filter (as would be the case, for example, in a particulate trap). The increase in line width of the oil spectrum can be seen in both FIGS. 4a and 4b but the spatial magnetic field perturbations caused by the different distributions of the debris cause a difference in the frequency shift patterns.

The spectra of $^{27}$Al, $^{51}$Y, $^{55}$Mn and $^{59}$Co water soluble standards (FIG. 5) were measured on the probe labelled 2 above, which can be tuned by the operator.

These elements are frequently included in differing proportions in the alloys from which aeroengine components are formed. When such aeroengine components wear, debris containing these elements will therefore be entrained in the engine oil, for instance. The quantification of these components using the described direct detection approach, together with that of other diagnostic nuclei, permits the alloy composition of the material entrained in the engine oil to determined. This in turn provides an indication of the alloy composition of the component or components subject to wear and hence a potential pointer to a failing component.

It is also possible to deliberately dope components with marker nuclei, preferably nuclei which are otherwise alien to the engine. NMR detection of such a nucleus in the debris would then identify uniquely the component subject to wear and the accumulation over time of debris containing the marker nuclei could be monitored to provide an indication of the rate of wear of the component. Moreover, the dopant need not be uniformly distributed within the component and could be used, for instance, to indicate wear beyond an acceptable limit by e.g. leaving a surface layer of the component dopant free.

All software programmable control and data analysis is carried out using a pc computer interfaced with the spectrometer through conventional electronics. The software is provided by the manufacturer of the bench-top NMR system.

In a further implementation of the system, which was substantially the same as the system of FIGS. 1 to 3, an NMR spectrometer equipped with a smaller permanent magnet (having a field strength of 0.054 Tesla and a half-height homogeneity of 20 ppm) was used with a $^1$H NMR probe of internal diameter 26 mm. The probe was joined to a flowing oil system such that the probe was a contiguous part of the piping containing the flowing oil. The magnet was maintained at a constant temperature for each study. A temperature of 80° C. was chosen for the study discussed below.

The flowing oil was also maintained at a selected constant temperature which was measured by a thermistor placed in the oil flow at the entrance to the probe. Upstream of the probe the oil flow piping had two parallel sections which rejoined 2.2 m above the probe. Manually operated valves allowed the oil to flow to the probe via one section or the other. One upstream section (the "debris section") was arranged so that debris could be placed into the oil of the section through a re-sealable aperture.

A weighed amount of "Rolls Royce ACS No.3003 oil contaminant" debris, purchased from Particle Technology Limited, was suspended in 4 ml oil and introduced into the debris section while there was no flow in it and it was sealed from the probe. The test was started with oil flowing to the probe via the non-debris section. Soon after the start of measurements, however, the valves were operated to switch the oil flow path to the debris section so that the debris was moved through the probe by the flowing oil.

The passage of the debris was measured using a pulse-acquire sequence, which allowed the data to be stored quickly, for example at 25 free induction decays (FIDs) a second. The magnitude of each FID was integrated between two convenient time points to provide a measure of the changes detected at each sampling time without using a Fourier Transform. The $^1$H oil FID decayed faster in the presence of the debris to decrease the measured integral. In the test, the oil temperature was 31.7° C., and the oil flowed at 5 liters per minute through the system. A total of 78.2 mg of debris was added.

Figure 6:
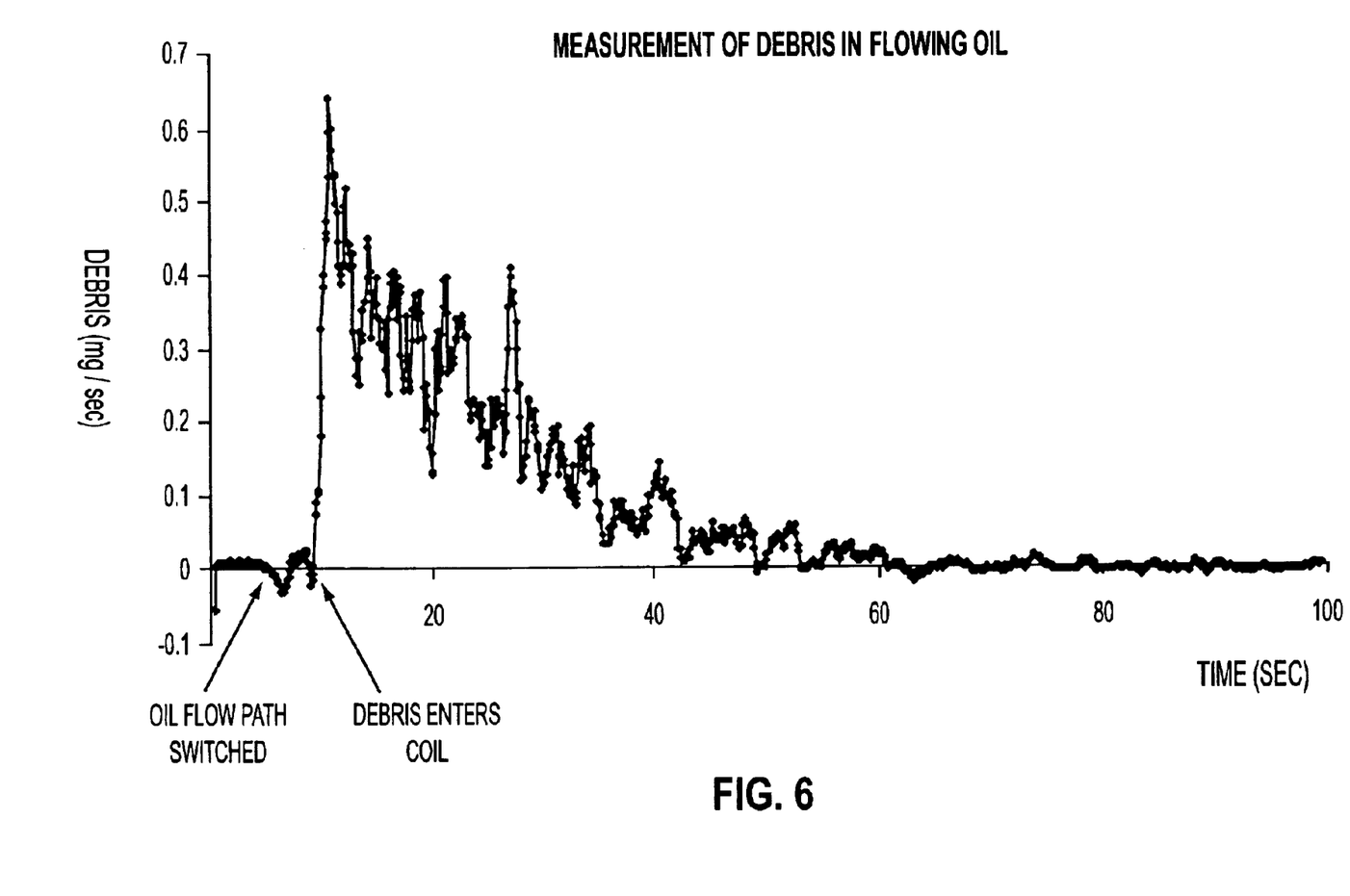
FIG. 6 shows the amount of debris measured in flowing oil over time using an indirect detection method in accordance with the present invention.

The measured integrals for the period before debris was introduced into the oil provided a baseline for the test. The total deviation from this baseline (i.e. the area under the curve) over the time period of the debris passage through the probe is proportional to the (known) amount of debris added and was used to calibrate the graph shown in FIG. 6, which shows (using a scale of mg of debris per second) how the measured integrals varied over the period of the test. FIG. 6 clearly demonstrates the ability of the system to detect the progression of an anomaly over time.

While the invention has been described in conjunction with the examples described above, many equivalent modifications and variations will be apparent to those skilled in the art when given this disclosure. Accordingly, the examples of the invention set forth above are considered to be illustrative and not limiting. various changes to the described examples may be made without departing from the spirit and scope of the invention.

What is claimed is:

1. A method for detecting an anomaly in a fluid system, the method comprising exposing a sample of the fluid system to a first, non-oscillating magnetic field; simultaneously exposing the sample to a second, oscillating magnetic field orthogonal to the first field; modulating one or both of the magnetic fields; detecting and capturing a resulting fluid resonance NMR signal from the sample; and analyzing the captured signal to look for changes in the signal caused by a variation of at least one of a width and a position of the fluid resonance in an NMR frequency spectrum, the variation being indicative of the presence of a particular anomaly.

2. A method according to claim 1, wherein it is the $^1$H NMR signal of the fluid system that is detected.

3. A method according to claim 1 used to detect the presence of ferromagnetic particles in the fluid system.

4. A method according to claim 1 used to detect the presence of a contaminant that has been intentionally doped with an NMR detectable nucleus.

5. A method of detecting the progression of an anomaly over time, comprising repeated application over time of a method according to claim 1, and keeping a record of the result of each application of the method.

6. A method according to claim 1, wherein the field strength of the non-oscillating magnetic filed is no higher than 1.5 T.

7. A method according to claim 1, wherein the fluid sample is an element of a liquid flow.

8. A system operable in accordance with the method of claim 1 for detecting anomalies in a fluid flow, wherein said system comprises a non-magnetic, non-metallic conduit through which said fluid flows; a first generator for generating said non-oscillating magnetic field across said conduit; a second generator for simultaneously generating said oscillating magnetic field across said conduit; modulation means for modulating one of said magnetic fields; a detector for detecting said resulting NMR signal from within said conduit; and processing means for extracting from said NMR signal information about said anomalies.

9. A system according to claim 8, wherein the second generator and the detector each comprise a coil surrounding the conduit.

10. A system according to claim 9, wherein a single coil performs both functions.

11. A system according to claim 8, further comprising or installed adjacent a debris collector.

12. A method for detecting the presence of a particulate contaminant or additive in a fluid system, comprising creating a first, non-oscillating magnetic field of a predetermined field strength across a sample of the fluid; intermittently exposing the sample of fluid to a second, oscillating magnetic field orthogonal to the first field to generate a fluid resonance NMR signal; detecting the NMR signal from the fluid sample; and analyzing the signal to look for changes caused by a variation of at least one of a width and a position of the fluid resonance in an NMR frequency spectrum, the variation being indicative of the presence of the particulate contaminant or additive in the fluid system.

13. A method according to claim 12, wherein it is the $^1$H NMR signal of the fluid system that is detected.

14. A method according to claim 12 used to detect the presence of ferromagnetic particles in the fluid system.

15. A method according to claim 12, wherein the step of analyzing the signal comprises transforming the detected signal into the NMR frequency spectrum, and identifying the variation of the at least one of the width and the position.

16. A method according to claim 12 used to detect the presence of a contaminant that has been intentionally doped with an NMR detectable nucleus.

17. A method of detecting the progression of an anomaly over time, comprising repeated application over time of a method according to claim 12, and keeping a record of the result of each application of the method.

18. A method according to claim 12, wherein the field strength of the non-oscillating magnetic filed is no higher than 1.5 T.

19. A method according to claim 12, wherein the fluid sample is an element of a liquid flow.

20. A system operable in accordance with the method of claim 12 for detecting anomalies in a fluid flow, wherein said system comprises a non-magnetic, non-metallic conduit through which said fluid flows; a first generator for generating said non-oscillating magnetic field across said conduit; a second generator for simultaneously generating said oscillating magnetic field across said conduit; modulation means for modulating one of said magnetic fields; a detector for detecting said resulting NMR signal from within said conduit; and processing means for extracting from said NMR signal information about said anomalies.

21. A method for detecting a particulate contaminant or a particulate additive in a fluid system, comprising creating a first, non-oscillating magnetic field across a sample of the fluid; exposing the sample of fluid to a second, oscillating magnetic field orthogonal to the first field; varying the frequency of the oscillating field and/or the field strength of the non-oscillating field to generate an NMR signal; detecting a fluid resonance NMR signal from the liquid sample; and analyzing the signal to look for changes caused by a variation of at least one of a width and a position of the fluid resonance in an NMR frequency spectrum, the variation being indicative of the presence of the particulate contaminant or additive in the fluid system.

22. A method according to claim 21, wherein it is the $^1$H NMR signal of the fluid system that is detected.

23. A method according to claim 21 used to detect the presence of ferromagnetic particles in the fluid system.

24. A method according to claim 21, wherein the step of analyzing the signal comprises transforming the detected signal into the NMR frequency spectrum, and identifying the variation of the at least one of the width and the position.

25. A method according to claim 21 used to detect the presence of a contaminant that has been intentionally doped with an NMR detectable nucleus.

26. A method of detecting the progression of an anomaly over time, comprising repeated application over time of a method according to claim 21, and keeping a record of the result of each application of the method.

27. A method according to claim 21, wherein the field strength of the non-oscillating magnetic filed is no higher than 1.5 T.

28. A method according to claim 21, wherein the fluid sample is an element of a liquid flow.

29. A system operable in accordance with the method of claim 21 for detecting anomalies in a fluid flow, wherein said system comprises a non-magnetic, non-metallic conduit through which said fluid flows; a first generator for generating said non-oscillating magnetic field across said conduit; a second generator for simultaneously generating said oscillating magnetic field across said conduit; modulation means for modulating one of said magnetic fields; a detector for detecting said resulting NMR signal from within said conduit; and processing means for extracting from said NMR signal information about said anomalies.

30. A method of directly detecting the presence of a contaminant or additive in a fluid system of a power plant or other machinery, comprising creating a first, non-oscillating magnetic field of a predetermined field strength of no higher than 1.5 T across a sample of the fluid; exposing the sample of fluid to a second, oscillating magnetic field orthogonal to the first to generate an NMR signal; detecting the resultant NMR signal; and analyzing the signal to look for changes indicative of the presence of the contaminant or additive in the fluid system;

the predetermined field strength of the non-oscillating field and the frequency of the oscillating field being selected in accordance with the magnetogyric ratio of the contaminant or additive to be detected.

31. A method according to claim 30, wherein the analysis of the NMR signal involves a determination of an amount of the contaminant or additive in the fluid system.

32. A method according to claim 30, comprising the sequential generation and detection of NMR signals at different frequencies and/or field strengths corresponding to the different magnetogyric ratios of the nuclei.

33. A method according to claim 30 used to detect the presence of a contaminant that has been intentionally doped with an NMR detectable nucleus.

34. A method of detecting the progression of an anomaly over time, comprising repeated application over time of a method according to claim 30, and keeping a record of the result of each application of the method.

35. A method according to claim 30, wherein the fluid sample is an element of a liquid flow.

36. A power plant or other machinery comprising a fluid flow which is fitted with a system operable in accordance with the method of claim 30 for detecting anomalies in the fluid flow, wherein said power plant or other machinery comprises a non-magnetic, non-metallic conduit through which said fluid flows; a first generator for generating said non-oscillating magnetic field across said conduit; a second generator for simultaneously generating said oscillating magnetic field across said conduit; modulation means for modulating one of said magnetic fields; a detector for detecting said resulting NMR signal from within said conduit; and processing means for extracting from said NMR signal information about said anomalies.

37. A method of directly detecting the presence of a particulate contaminant or particulate additive in a fluid system, comprising creating a first, non-oscillating magnetic field of a predetermined field strength of no higher than 1.5 T across a sample of the fluid; exposing the sample of fluid to a second, oscillating magnetic field orthogonal to the first to generate an NMR signal; detecting the resultant NMR signal; and analyzing the signal to look for changes indicative of the presence of the contaminant or additive in the fluid system;

the predetermined field strength of the non-oscillating field and the frequency of the oscillating field being selected in accordance with the magnetogyric ratio of the particulate contaminant or particulate additive to be detected.

38. A method according to claim 37, wherein the analysis of the NMR signal involves a determination of an amount of the particulate contaminant or particulate additive in the fluid system.

39. A method according to claim 37, comprising the sequential generation and detection of NMR signals at different frequencies and/or field strengths corresponding to the different magnetogyric ratios of the nuclei.

40. A method according to claim 37, used to detect the presence of a particulate contaminant that has been intentionally doped with an NMR detectable nucleus.

41. A method of detecting the progression of an anomaly over time, comprising repeated application over time of a method according to claim 37, and keeping a record of the result of each application of the method.

42. A method according to claim 37, wherein the fluid sample is an element of a liquid flow.

43. A system operable in accordance with the method of claim 37 for detecting anomalies in a fluid flow, wherein said system comprises a non-magnetic, non-metallic conduit through which said fluid flows; a first generator for generating said non-oscillating magnetic field across said conduit; a second generator for simultaneously generating said oscillating magnetic field across said conduit; modulation means for modulating one of said magnetic fields; a detector for detecting said resulting NMR signal from within said conduit; and processing means for extracting from said NMR signal information about said anomalies.

* * * * *